United States Patent
Lu et al.

(10) Patent No.: US 12,097,589 B2
(45) Date of Patent: Sep. 24, 2024

(54) METHOD FOR GRINDING SINGLE-CRYSTAL DIAMOND

(71) Applicant: Huaqiao University, Fujian (CN)

(72) Inventors: Jing Lu, Fujian (CN); Xipeng Xu, Fujian (CN); Yanhui Wang, Fujian (CN); Qiufa Luo, Fujian (CN); Zhongqiang Ma, Fujian (CN)

(73) Assignee: Huaqiao University, Fujian (CN)

( * ) Notice: Subject to any disclaimer, the term of this patent is extended or adjusted under 35 U.S.C. 154(b) by 352 days.

(21) Appl. No.: 17/728,319

(22) Filed: Apr. 25, 2022

(65) Prior Publication Data

US 2022/0288741 A1   Sep. 15, 2022

Related U.S. Application Data

(63) Continuation of application No. PCT/CN2020/123172, filed on Oct. 23, 2020.

(51) Int. Cl.
*B24B 19/22* (2006.01)
*B24B 1/00* (2006.01)

(52) U.S. Cl.
CPC ............... *B24B 19/22* (2013.01); *B24B 1/00* (2013.01)

(58) Field of Classification Search
CPC ... B24D 5/02; B24D 3/14; B24D 3/16; B24D 3/18; B24D 18/0009; B24D 18/0054; B24B 19/22
See application file for complete search history.

(56) References Cited

U.S. PATENT DOCUMENTS

| | | | | |
|---|---|---|---|---|
| 4,157,897 A | * | 6/1979 | Keat | B24D 7/00 51/308 |
| 2016/0194540 A1 | * | 7/2016 | Wang | B24D 11/00 51/307 |
| 2018/0237945 A1 | | 8/2018 | Osawa et al. | |

FOREIGN PATENT DOCUMENTS

| | | | | |
|---|---|---|---|---|
| CN | 1134692 A | * | 10/1996 | ............... B24D 3/14 |
| CN | 1947939 A | | 4/2007 | |
| CN | 101302403 A | | 11/2008 | |
| CN | 101972979 A | | 2/2011 | |
| CN | 103282157 A | | 9/2013 | |
| CN | 106425825 A | * | 2/2017 | ............ B24B 37/00 |
| CN | 207997223 U | | 10/2018 | |
| CN | 109590811 A | | 4/2019 | |
| CN | 110026831 A | | 7/2019 | |
| CN | 110774118 A | | 2/2020 | |

OTHER PUBLICATIONS

International Search Report and English Translation cited in PCT/CN2020/123172 mailed Feb. 1, 2021, 6 pages.
Written Opinion and English Translation cited in PCT/CN2020/123172 mailed Feb. 1, 2021, 9 pages.

* cited by examiner

*Primary Examiner* — Joel D Crandall
(74) *Attorney, Agent, or Firm* — Cooper Legal Group, LLC

(57) ABSTRACT

Carbon atoms of a single-crystal diamond and active abrasives are used to produce a chemical reaction to form carbides under a specific grinding condition of no higher than a graphitization temperature, and a hard abrasive is used to remove the carbides.

15 Claims, 3 Drawing Sheets

METHOD FOR GRINDING SINGLE-CRYSTAL DIAMOND

RELATED APPLICATIONS

This application is a continuation of and claims priority to International patent application number PCT/CN2020/123172, filed on Oct. 23, 2020, which claims priority to Chinese patent application number 201911010812.3, filed on Oct. 23, 2019. International patent application number PCT/CN2020/123172 and Chinese patent application number 201911010812.3 are incorporated herein by reference.

FIELD OF THE DISCLOSURE

The present disclosure relates to a technical field of ultra-precision grinding, and in particular relates to a method for grinding a single-crystal diamond.

BACKGROUND OF THE DISCLOSURE

Single-crystal diamonds have a unique face-centered cubic crystal structure and have excellent physical, chemical, and electrical properties. For example, single-crystal diamonds have high thermal conductivity and are an ideal heat dissipation material for electronic devices, single-crystal diamonds have high light transmittance and are an ideal material for infrared optical window and high power laser window, single-crystal diamonds have high chemical stability and guarantee that devices are stable when used in a harsh environment, and single-crystal diamonds have a wide band gap and guarantee high stability and high reliability in a production of semiconductor devices. Single-crystal diamonds are the most ideal material for third-generation semiconductors due to these excellent characteristics. However, as diamonds are the hardest substance in nature, the single-crystal diamonds have the characteristics of high hardness and high brittleness. Physical and chemical properties of single-crystal diamonds are stable, process difficulty is very large, and special processing technology is needed to obtain the single-crystal diamonds that meet the needs of semiconductor surface quality.

At present, the traditional methods for fast removal of the diamonds mainly include mechanical grinding, thermochemical processing, and friction chemical processing. When the mechanical grinding is used, a diamond grinding wheel or diamond grinding powder is used as the grinding medium, which has characteristics of simple process and good stability. However, an efficiency of pure mechanical removal is low, a micro-surface quality of the diamond is poor, and the diamond is prone to cause defects, such as micro-cracks, grooves, scratches, etc. The diamond has obvious anisotropy. When the thermochemical processing is used, processing efficiencies of the single-crystal diamond and polycrystalline diamond are high, and better surface quality can be obtained. However, a high processing temperature of the single-crystal diamond and the polycrystalline diamond will result in softening deformation and low wear resistance of a polishing disc, and requirements of a surface accuracy and avoidance of subsurface damage of the diamond cannot be guaranteed. In the friction chemical processing, a dynamic friction method is used, which generates heat by high-speed scratching instead of local heating of the diamond, and a processing equipment and a processing environment are improved. However, the problem of the polishing disc being easily softened due to high temperature has not been solved, and the surface accuracy of the diamond is still poor. The thermochemical processing and the friction chemical processing achieve reactive removal through a graphitization phase transition of the diamond, and excessive consumption and excessive damage to the diamond cannot be avoided.

BRIEF SUMMARY OF THE DISCLOSURE

An objective of the present disclosure is to provide a method for grinding a single-crystal diamond to solve the deficiencies of existing diamonds in which a processing efficiency is low, surface accuracy is low, and surface damage and subsurface damage are large.

A technical solution of the present disclosure is as follows.

A method for grinding a single-crystal diamond, comprising:

(1) mixing a base material, an active abrasive, and a hard abrasive to obtain a first material and filtering, wherein the base material comprises at least one of ceramic, metal, or a metal-ceramic composite material, the active abrasive comprises a first abrasive configured to react with the single-crystal diamond to form at least one carbide, the hard abrasive comprises a second abrasive configured to remove the at least one carbide, a mass ratio of the active abrasive and the hard abrasive is 1-5:10, a mass ratio of the base material and a sum of the hard abrasive and the active abrasive is 1-2:2;

(2) mixing the first material obtained in step (1) and at least one additive to obtain a second material, and sieving the second material;

(3) adding a wetting agent into the second material obtained in step (2), molding under pressure to obtain a compact, and sintering the compact to obtain a grinding wheel;

(4) fixing the grinding wheel and the single-crystal diamond to a grinding machine, and grinding a surface of the single-crystal diamond in combination with a grinding liquid using the grinding wheel, wherein a grinding process between the grinding wheel and the single-crystal diamond comprises: controlling a grinding temperature of surfaces of the active abrasive in the grinding wheel and the single-crystal diamond by controlling a revolution speed of the grinding wheel to enable the grinding temperature to be lower than a graphitization temperature of the single-crystal diamond to ensure that the single-crystal diamond is reacted to form at least one carbide and to avoid graphitization, so that a hardness of the single-crystal diamond decreases; and grinding and removing the at least one carbide by the hard abrasive in the grinding wheel to finally obtain the single-crystal diamond with a low surface roughness, a low surface damage and a low subsurface damage at the same time.

In a preferred embodiment of the present disclosure, a particle size of the base material is 0.1 μm-10 μm (i.e., W0.1-W10).

In a preferred embodiment of the present disclosure, the active abrasive is at least one of iron powder, tungsten powder, molybdenum powder, chromium powder, or titanium powder.

In a preferred embodiment of the present disclosure, a particle size of the active abrasive is 3 μm-40 μm (i.e., W3-W40).

In a preferred embodiment of the present disclosure, the hard abrasive is at least one of diamond, alumina, cubic boron nitride, silicon nitride, or silicon carbide.

In a preferred embodiment of the present disclosure, a particle size of the hard abrasive is 3 μm-40 μm (i.e., W3-W40).

In a preferred embodiment of the present disclosure, the grinding liquid is deionized water.

In a preferred embodiment of the present disclosure, the at least one additive is at least one of alumina hollow spheres, polymethlymethacrylate (PMMA) microspheres, glass hollow spheres, or carbon powder.

In a preferred embodiment of the present disclosure, the wetting agent is at least one of starch, water glass, or dextrin.

In a preferred embodiment of the present disclosure, the sintering to obtain the grinding wheel comprises: heating a temperature of the compact from room temperature to 295° C.-305° C. at a first heating rate of 2.5° C./min-4° C./min, wherein a first heating time is 75 minutes-120 minutes, continually heating the temperature of the compact from 295° C.-305° C. to 680° C.-830° C. at a second heating rate of 3° C./min-5° C./min according to the base material, wherein a second heating time is 75-175 minutes, maintaining the temperature of the compact for 30 minutes-60 minutes, and cooling to room temperature following a cooling of a furnace.

In a preferred embodiment of the present disclosure, during the grinding process, the revolution speed of the grinding wheel is 1500 rpm and a feed speed of the single-crystal diamond is 20 μm/min.

In a preferred embodiment of the present disclosure, during the grinding process, the revolution speed of the grinding wheel is 1000 rpm-5000 rpm and a feed speed of the single-crystal diamond is 10 μm/min-70 μm/min.

In a preferred embodiment of the present disclosure, the single-crystal diamond is a first circular sheet no less than 1 inch in diameter or a second circular sheet no less than 10 mm×10 mm×1 mm.

The present disclosure has the following advantages.

1. The present disclosure uses carbon atoms of a large-size (e.g., inch-size) single-crystal diamond and active abrasives to produce a chemical reaction to form carbides under a specific grinding condition of no higher than a graphitization temperature, and a hard abrasive is used to remove the carbides to achieve high efficiency and high quality for grinding a surface of the large-size single-crystal diamond at the same time.

2. Grinding process parameters (e.g., a revolution speed) of the present disclosure are far lower than requirements of dynamic friction, and energy consumption is low.

3. The grinding liquid of the present disclosure is deionized water, which can effectively avoid environmental pollution from a grinding waste fluid.

4. The present disclosure differs from a traditional graphitization removal method of diamonds, and the method of the present disclosure can obtain a high-quality diamond surface with high surface accuracy, low surface roughness, and small processing damage (e.g., few cracks and shallow grooves). A processing cost of the method of the present disclosure is efficiently reduced, and a good foundation is established for an application of the large-size single-crystal diamond in high techniques.

BRIEF DESCRIPTION OF THE DRAWINGS

FIG. 5A illustrates a roughly ground diamond surface, FIG. 5B illustrates a finely ground diamond surface, and FIG. 5C illustrates a diamond surface after processing dynamic friction in a comparative embodiment.

DETAILED DESCRIPTION OF THE EMBODIMENTS

The technical solutions of the present disclosure will be further described in combination with the accompanying embodiments and drawings.

Embodiment 1

(1) A base material is copper powder with a particle size (e.g., an average particle size) of 50 μm and a density of 8.92 g/cm³. An active abrasive 1 is iron powder with a particle size (e.g., an average particle size) of 40 μm, and a hard abrasive 2 is alumina with a particle size of 40 μm. A mass ratio of the active abrasive 1 and the hard abrasive 2 is 1:2, and a mass ratio of the base material and a sum of the hard abrasive 2 and the active abrasive 1 is 1:2. The base material, the hard abrasive 2, and the active abrasive 1 are mixed to obtain a first material.

(2) The first material obtained in step (1) is mixed with starch and alumina hollow spheres and sieved. Dextrin solution is then added, mixed, and sieved to obtain a second material. Final concentrations of the starch and the dextrin solution after additions are all 5 wt %, a final concentration of the alumina hollow spheres is 30 wt %, and a size (e.g., an average size) of the alumina hollow spheres is 40 μm.

(3) Next, the second material obtained in step (2) is molded by cold pressing and sintered to obtain a grinding wheel. A specific sintering process is as follows: a temperature of a furnace is raised from room temperature (e.g., 20° C.) to 300° C. at a first heating rate of 2.5° C./min, and a first heating time is 120 minutes. The temperature is then raised from 300° C. to 780° C. at a second heating rate of 5° C./min, and a second heating time is 96 minutes. The temperature is then maintained for 30 minutes and is finally cooled to room temperature following a cooling of the furnace.

Figure 1:
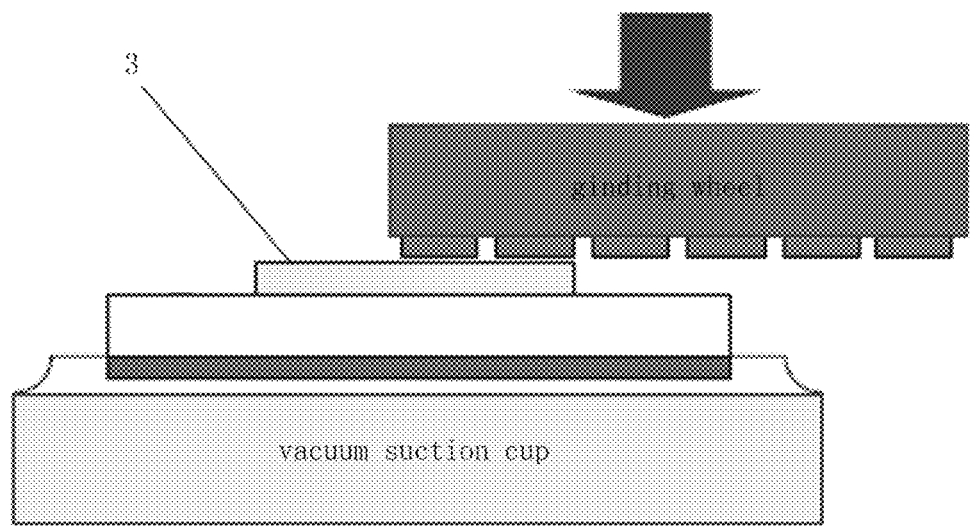
FIG. 1 illustrates a structural view of an auto-rotational grinding machine of an embodiment of the present disclosure.
Figure 2:
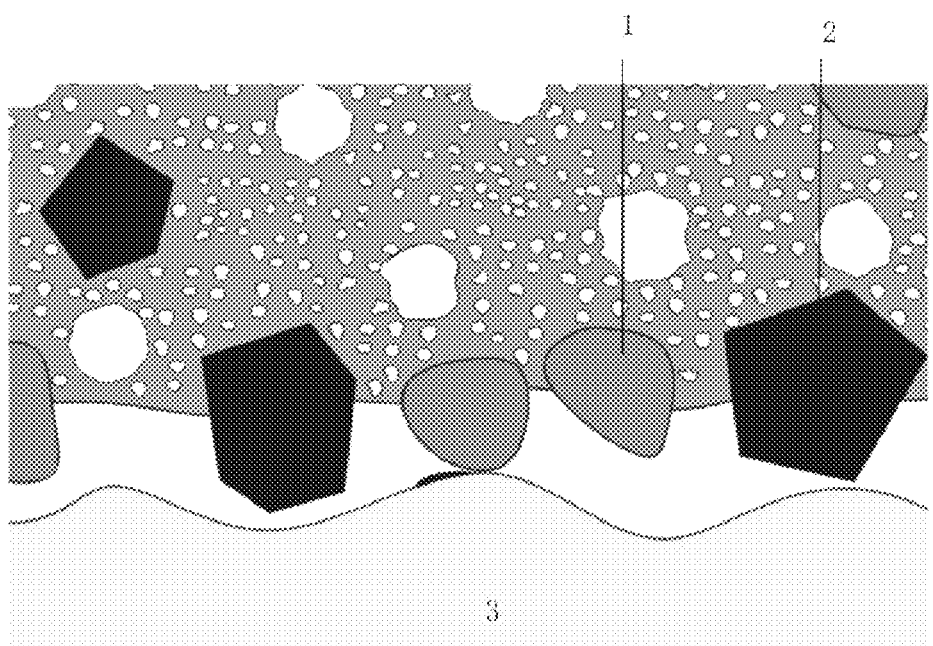
FIG. 2 illustrates a structural view of the present disclosure in which a grinding wheel contacts with a surface of a large-size (e.g., inch-size) single-crystal diamond, wherein a metal abrasive particle is an active abrasive of the present disclosure.
Figure 3:
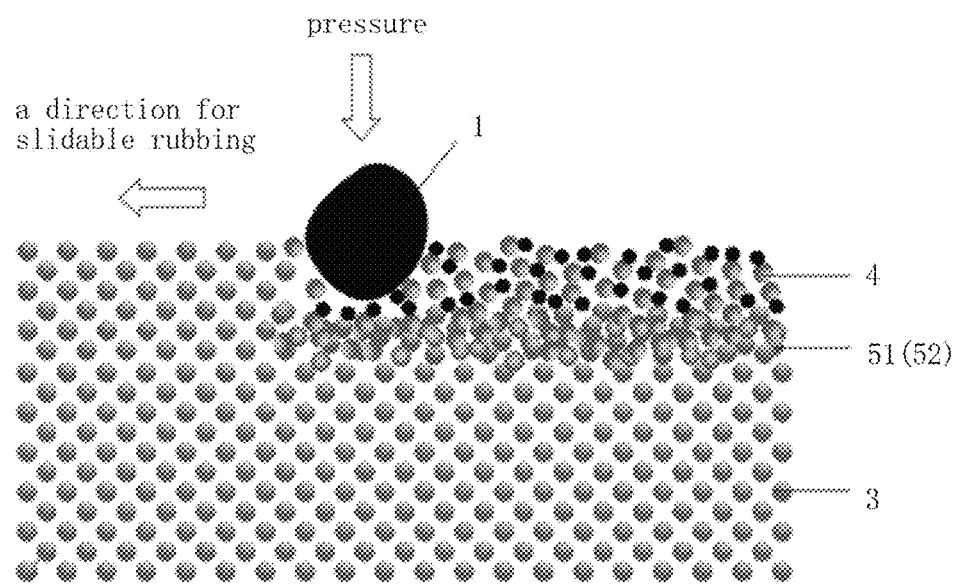
FIG. 3 illustrates a first diagram of a grinding principle of the embodiment of the present disclosure.
Figure 4:
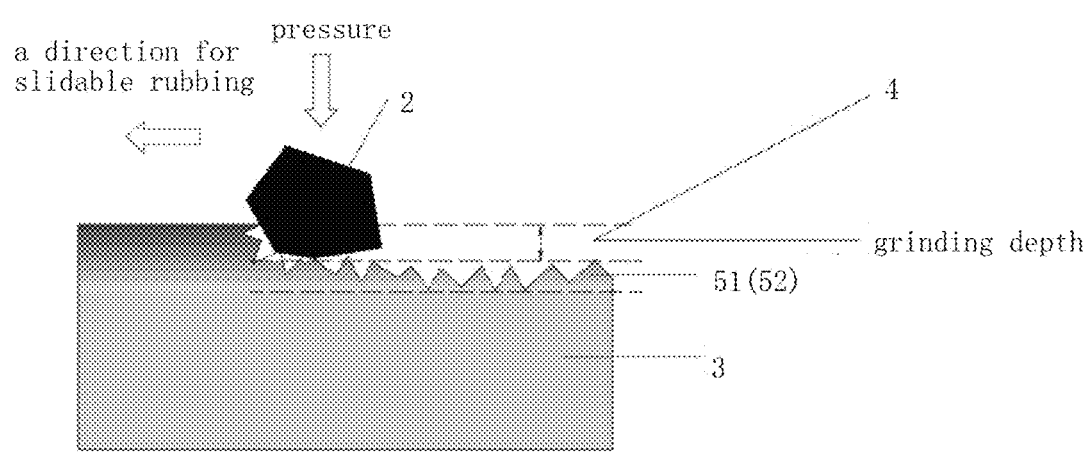
FIG. 4 illustrates a second diagram of the grinding principle of the embodiment of the present disclosure.
Figures 5A, 5B, 5C:
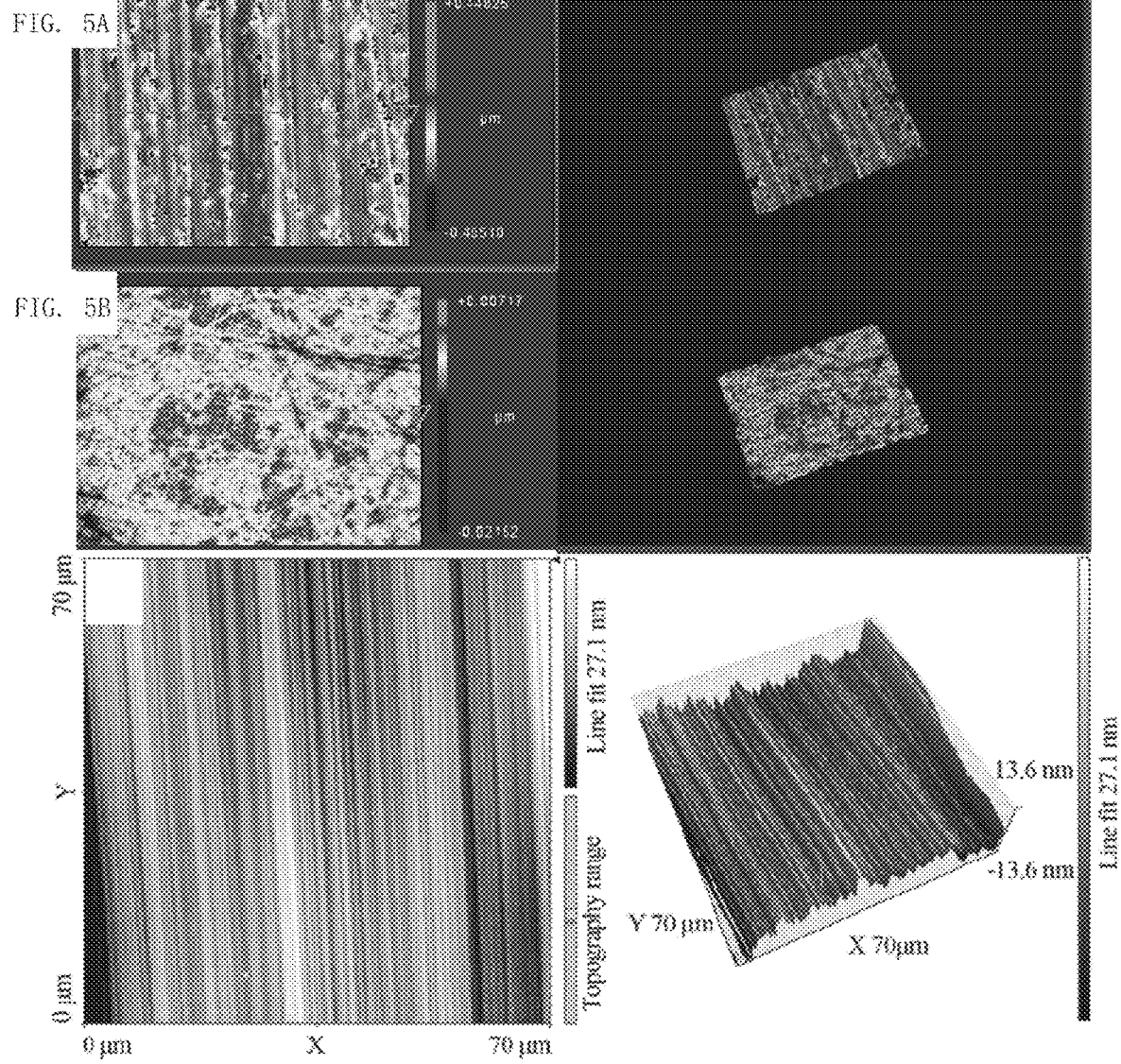
FIGS. 5A, 5B, and 5C illustrate surface morphologies before or after Embodiments 1 and 2 of the present disclosure are ground.

(4) The grinding wheel and a single-crystal diamond (e.g., a large-size (e.g., inch-size) single-crystal diamond 3) (a diameter of the large-size single-crystal diamond 3 is 1 inch) are fixed on an operation board of an auto-rotational grinding machine, as shown in FIG. 1. The grinding wheel is used to grind a surface of the large-size single-crystal diamond 3 in combination with a grinding fluid, as shown in FIGS. 2-5C. During the grinding process, grinding temperatures of surfaces of the active abrasive 1 in the grinding wheel and the large-size single-crystal diamond 3 are precisely controlled by controlling a revolution speed of the grinding wheel, so that the grinding temperatures are lower than a graphitization temperature of diamonds to ensure that a surficial layer of the large-size single-crystal diamond 3 is reacted to form carbides 4 with low-hardness and to avoid from graphitization. At the same time, the hard abrasive 2 in the grinding wheel grinds and removes the carbides 4 on the surface of the large-size single-crystal diamond 3, and the large-size single-crystal diamond 3 with a low surface roughness, low surface damage 51, and low subsurface damage 52 is finally obtained. A removal rate of the grinding wheel of this embodiment is 50 µm/min, a surface roughness of the large-size single-crystal diamond 3 is 34 nm, and a total thickness variety (TTV) of the large-size single-crystal diamond 3 is 5.1 µm.

A spindle speed (that is, a revolution speed of the grinding wheel) of the auto-rotational grinding machine is 1500 revolutions per minute (rpm), a feed speed is 50 µm/min, a revolution speed of the operation board is 200 rpm, and a grinding time is 5 minutes.

Embodiment 2

(1) A base material is ceramic powder with a particle size (e.g., an average particle size) of 1 µm and a density of 2.6 g/cm$^3$. An active abrasive 1 is iron powder with a particle size (e.g., an average particle size) of 10 µm, and a hard abrasive 2 is alumina with a particle size of 10 µm. A mass ratio of the active abrasive 1 and the hard abrasive 2 is 1:2, and a mass ratio of the base material and a sum of the hard abrasive 2 and the active abrasive 1 is 1:2. The base material, the hard abrasive 2, and the active abrasive 1 are mixed to obtain a first material.

(2) The first material obtained in step (1) is mixed with starch and alumina hollow spheres and sieved. Dextrin solution is then added, mixed, and sieved to obtain a second material. Final concentrations of the starch and the dextrin solution after additions are all 5 wt %, and a final concentration of the alumina hollow spheres is 30 wt %.

(3) Next, the second material obtained in step (2) is molded by cold pressing and sintered to obtain a grinding wheel. A specific sintering process is as follows: a temperature of a furnace is raised from room temperature to 300° C. at a first heating rate of 2.5° C./min, and a first heating time is 120 minutes. The temperature is then raised from 300° C. to 680° C. at a second heating rate of 5° C./min, and a second heating time is 76 minutes. The temperature is then maintained for 30 minutes and is finally cooled to room temperature following a cooling of the furnace.

(4) The grinding wheel and a single-crystal diamond (e.g., a large-size (e.g., inch-size) single-crystal diamond 3) (a size of the large-size single-crystal diamond 3 is 10 mm×10 mm×1 mm) are fixed on an operation board of an auto-rotational grinding machine, as shown in FIG. 1. The grinding wheel is used to grind a surface of the large-size single-crystal diamond 3 in combination with a grinding fluid, as shown in FIGS. 2-5C. During the grinding process, grinding temperatures of surfaces of the active abrasive 1 in the grinding wheel and the large-size single-crystal diamond 3 are precisely controlled by controlling a revolution speed of the grinding wheel, so that the grinding temperatures are lower than a graphitization temperature of diamonds to ensure that a surficial layer of the large-size single-crystal diamond 3 is reacted to form carbides 4 and to avoid graphitization, so that a hardness of the large-size single-crystal diamond 3 decreases. At the same time, the hard abrasive 2 in the grinding wheel grinds and removes the carbides 4 on the surface of the large-size single-crystal diamond 3, and the large-size single-crystal diamond 3 with a low surface roughness, low surface damage 51, and low subsurface damage 52 is finally obtained. A removal rate of the grinding wheel of this embodiment is 20 µm/min, a surface roughness of the large-size single-crystal diamond 3 is 1.6 nm, and a total thickness variety (TTV) of the large-size single-crystal diamond 3 is 2.8 µm.

A spindle speed (that is, a revolution speed of the grinding wheel) of the auto-rotational grinding machine is 1500 revolutions per minute (rpm), a feed speed is 20 µm/min, a revolution speed of the operation board is 200 rpm, and a grinding time is 10 minutes.

Comparative Embodiment

The traditional mechanical removing method, the traditional dynamic friction processing method, and the traditional thermochemical processing method are main rough processing methods of diamonds. High hardness and good wear resistance of the diamonds result in low grinding efficiency and long working hours. Grinding with grinding wheels is a main method of the mechanical removing. The grinding wheels are mainly divided into metal bond grinding wheels, ceramic bond grinding wheels, and metal-ceramic composite bond grinding wheels. When a revolution speed of the traditional grinding wheel is no more than 600 rpm, a grinding efficiency is basically 0. When the revolution speed of the traditional grinding wheel is 900 rpm, the grinding efficiency is 0.2 µm/min. When the revolution speed of the traditional grinding wheel is 1500 rpm, the grinding efficiency is 0.6 µm/min. Therefore, a grinding efficiency of a single-crystal diamond is extremely low. The mechanical removing is a main processing method of the traditional grinding wheel, and the diamond is ground using a hardness-to-hardness method, resulting in deep scratches and poor surface quality.

The traditional dynamic friction processing method is as follows: the diamond contacts with a metal polishing disc with a high revolution speed (a linear speed of 15-25 m/s) at a high pressure (3-7 MPa) in an atmospheric environment. A violent friction between the metal polishing disc and the diamond produces a large amount of heat to form a high temperature at an interface, which provides conditions for a thermochemical reaction of the diamond. After the diamond is graphitized and diffused to achieve polishing effects, the diamond is processed by a dynamic friction processing technology with a polishing pressure of 65 N and a revolution speed of 8000 rpm. A removal rate of the diamond is 2.3 µm/min, and a surface roughness Ra of the diamond is 0.33 µm.

A principle of the thermochemical processing method is that carbon atoms in the diamond are diffused to transition metals under high temperatures, and a surface of the diamond is graphitized and oxidized. The thermochemical processing method has high equipment requirements. Not only is high temperature required, but also a specific environmental atmosphere is required. When a temperature is 1000° C., a revolution speed is 5 rpm, and the surface roughness Ra of the diamond is 0.28 µm. In both of the dynamic friction processing method and the thermochemical processing method, the diamond is processed using the principle that the diamond is graphitized at high temperature. However, high temperature tends to soften an operation disk and easily leads to uneven heating. A workpiece of the diamond is prone to chip, and an overall surface accuracy is low.

The aforementioned embodiments are merely some embodiments of the present disclosure, and the scope of the disclosure is not limited thereto. Thus, it is intended that the present disclosure cover any modifications and variations of the presently presented embodiments provided they are

What is claimed is:

1. A method for grinding a single-crystal diamond, comprising:
   (1) mixing a base material, an active abrasive, and a hard abrasive to obtain a first material, wherein the base material comprises at least one of ceramic, metal, or a metal-ceramic composite material, the active abrasive comprises a first abrasive configured to react with the single-crystal diamond to form at least one carbide, the hard abrasive comprises a second abrasive configured to remove the at least one carbide, a mass ratio of the active abrasive and the hard abrasive is 1-5:10, a mass ratio of the base material and a sum of the hard abrasive and the active abrasive is 1-2:2;
   (2) mixing the first material obtained in step (1) and at least one additive to obtain a second material, and sieving the second material;
   (3) adding a wetting agent into the second material obtained in step (2), molding under pressure to obtain a compact, and sintering the compact to obtain a grinding wheel;
   (4) fixing the grinding wheel and the single-crystal diamond to a grinding machine, and grinding a surface of the single-crystal diamond in combination with a grinding liquid using the grinding wheel, wherein a grinding process between the grinding wheel and the single-crystal diamond comprises:
      controlling a grinding temperature of surfaces of the active abrasive in the grinding wheel and the single-crystal diamond by controlling a revolution speed of the grinding wheel to enable the grinding temperature to be lower than a graphitization temperature of the single-crystal diamond to ensure that the single-crystal diamond is reacted to form the at least one carbide and to avoid graphitization, so that a hardness of the single-crystal diamond decreases; and
      grinding and removing the at least one carbide by the hard abrasive in the grinding wheel to finally obtain the single-crystal diamond.

2. The method according to claim 1, wherein a particle size of the base material is 0.1 μm-10 μm.

3. The method according to claim 1, wherein the active abrasive is at least one of iron powder, tungsten powder, molybdenum powder, chromium powder, or titanium powder.

4. The method according to claim 1, wherein a particle size of the active abrasive is 3 μm-40 μm.

5. The method according to claim 1, wherein the hard abrasive is at least one of diamond, alumina, cubic boron nitride, silicon nitride, or silicon carbide.

6. The method according to claim 1, wherein a particle size of the hard abrasive is 3 μm-40 μm.

7. The method according to claim 1, wherein the grinding liquid is deionized water.

8. The method according to claim 1, wherein the at least one additive is at least one of alumina hollow spheres, polymethlymethacrylate (PMMA) microspheres, glass hollow spheres, or carbon powder.

9. The method according to claim 1, wherein the wetting agent is at least one of starch, water glass, or dextrin.

10. The method according to claim 1, wherein the sintering to obtain the grinding wheel comprises:
    heating a temperature of the compact from room temperature to 295° C.-305° C. at a first heating rate of 2.5° C./min-4° C./min, wherein a first heating time is 75 minutes-120 minutes,
    continually heating the temperature of the compact from 295° C.-305° C. to 680° C.-830° C. at a second heating rate of 3° C./min-5° C./min according to the base material, wherein a second heating time is 75-175 minutes,
    maintaining the temperature of the compact for 30 minutes-60 minutes, and
    cooling to room temperature following a cooling of a furnace.

11. The method according to claim 1, wherein:
    during the grinding process, the revolution speed of the grinding wheel is 1500 rpm and a feed speed of the single-crystal diamond is 20 μm/min.

12. The method according to claim 1, wherein:
    during the grinding process, the revolution speed of the grinding wheel is 1000 rpm-5000 rpm and a feed speed of the single-crystal diamond is 10 μm/min-70 μm/min.

13. The method according to claim 1, wherein the single-crystal diamond is a first circular sheet no less than 1 inch in diameter or a second circular sheet no less than 10 mm×10 mm×1 mm.

14. A method for grinding a single-crystal diamond, comprising:
    a method for preparing a grinding wheel, and
    a grinding method, wherein the method for preparing the grinding wheel comprises:
       (1) mixing a base material, an active abrasive, and a hard abrasive to obtain a first material, wherein the base material comprises at least one of ceramic, metal, or a metal-ceramic composite material, the active abrasive comprises a first abrasive configured to react with the single-crystal diamond to form at least one carbide, the hard abrasive comprises a second abrasive configured to remove the at least one carbide, a mass ratio of the active abrasive and the hard abrasive is 1-5:10, a mass ratio of the base material and a sum of the hard abrasive and the active abrasive is 1-2:2, and the active abrasive is at least one of iron powder, tungsten powder, molybdenum powder, chromium powder, or titanium powder;
       (2) mixing the first material obtained in step (1) and at least one additive to obtain a second material, and sieving the second material; and
       (3) adding a wetting agent into the second material obtained in step (2), molding under pressure to obtain a compact, and sintering the compact to obtain a grinding wheel;
    wherein the grinding method comprises:
       (4) fixing the grinding wheel and the single-crystal diamond to a grinding machine, and grinding a surface of the single-crystal diamond in combination with a grinding liquid using the grinding wheel, wherein during a grinding process of the grinding wheel, a revolution speed of the grinding wheel is 1000-5000 rpm and a feed speed is 10-70 μm/min.

15. The method according to claim 14, wherein:
    during the grinding process of the grinding wheel, the revolution speed of the grinding wheel is 1500 rpm and the feed speed of the single-crystal diamond is 20 μm/min.

* * * * *